(12) United States Patent
Guo et al.

(10) Patent No.: US 12,205,652 B2
(45) Date of Patent: Jan. 21, 2025

(54) METHOD FOR READING MEMORY DEVICE AND MEMORY DEVICE

(71) Applicant: YANGTZE MEMORY TECHNOLOGIES CO., LTD., Wuhan (CN)

(72) Inventors: Xiaojiang Guo, Wuhan (CN); Chao Zhang, Wuhan (CN); Haibo Li, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 203 days.

(21) Appl. No.: 18/090,454

(22) Filed: Dec. 28, 2022

(65) Prior Publication Data
US 2023/0148206 A1 May 11, 2023

Related U.S. Application Data

(63) Continuation of application No. PCT/CN2021/124946, filed on Oct. 20, 2021.

(30) Foreign Application Priority Data

Oct. 20, 2020 (CN) .......................... 202011121625.5

(51) Int. Cl.
*G11C 16/26* (2006.01)
*G11C 16/08* (2006.01)
*G11C 16/12* (2006.01)

(52) U.S. Cl.
CPC .............. *G11C 16/26* (2013.01); *G11C 16/08* (2013.01); *G11C 16/12* (2013.01)

(58) Field of Classification Search
CPC ......... G11C 16/26; G11C 16/08; G11C 16/12; G11C 16/0483; G11C 11/5642; G11C 16/3404

(Continued)

(56) References Cited

U.S. PATENT DOCUMENTS

2003/0090580 A1* 5/2003 Petropoulos ........... H04N 25/69
348/304
2006/0221714 A1 10/2006 Li et al.
(Continued)

FOREIGN PATENT DOCUMENTS

CN 101861623 A 10/2010
CN 103814408 A 5/2014
(Continued)

OTHER PUBLICATIONS

First Office action issued in corresponding Chinese Application No. 202011121625.5, mailed on May 20, 2021, 7 pages.
(Continued)

*Primary Examiner* — Michael T Tran
(74) *Attorney, Agent, or Firm* — BAYES PLLC

(57) ABSTRACT

A method for reading a memory device is provided. The memory device includes a plurality of word lines and a plurality of multi-bit memory cells connected to the plurality of word lines, and each of the multi-bit memory cells is configured such that a stored value of the multi-bit memory cell is read through multi-level preset read voltages. The method includes: defining at least one read offset for each of the multi-level preset read voltages respectively, selecting at least one of the multi-level preset read voltages as at least one sampling voltage, reading a multi-bit memory cell on an adjacent word line of a to-be-read multi-bit memory cell, and setting at least one offset flag, each representing a size of a respective one of at least one read offset, according to a sampling reading value of each of the at least one sampling voltage.

15 Claims, 3 Drawing Sheets

(58) Field of Classification Search
USPC .................................. 365/189.011, 189.05
See application file for complete search history.

(56) References Cited

U.S. PATENT DOCUMENTS

| | | | |
|---|---|---|---|
| 2014/0040531 A1* | 2/2014 | Wu | G11C 16/26 |
| | | | 711/E12.008 |
| 2016/0055057 A1* | 2/2016 | Shin | G06F 11/1012 |
| | | | 714/764 |
| 2017/0168740 A1* | 6/2017 | Liu | G11C 16/26 |
| 2017/0200505 A1* | 7/2017 | Jin | G11C 16/0466 |
| 2019/0267104 A1 | 8/2019 | Leee et al. | |
| 2020/0005878 A1 | 1/2020 | Lu et al. | |
| 2020/0183592 A1* | 6/2020 | Lim | G11C 16/26 |
| 2021/0019078 A1* | 1/2021 | Sheperek | G11C 16/28 |

FOREIGN PATENT DOCUMENTS

| | | |
|---|---|---|
| CN | 108986865 A | 12/2018 |
| CN | 112201297 A | 1/2021 |

OTHER PUBLICATIONS

International Search Report issued in corresponding International Application No. PCT/CN2021/124946, mailed on Jan. 18, 2022, 6 pages.
Written Opinion issued in corresponding International Application No. PCT/CN2021/124946, mailed on Jan. 18, 2022, 4 pages.

* cited by examiner

METHOD FOR READING MEMORY DEVICE AND MEMORY DEVICE

CROSS-REFERENCE TO RELATED APPLICATIONS

This application is a continuation of International Application No. PCT/CN2021/124946, filed on Oct. 20, 2021, which claims the benefit of priority to Chinese Patent Application No. 202011121625.5 filed on Oct. 20, 2020. The entire contents of each of these two applications are expressly incorporated herein by reference.

TECHNICAL FIELD

Implementations of the present disclosure relate to the field of semiconductor, and particularly to a method for reading a memory device and a memory device.

BACKGROUND

In a three-dimensional NAND flash memory (3D NAND Flash), one-time programming is typically used for trinary-level cell (TLC) (i.e., 3-bit data being stored per memory cell) products. The state of memory cells of a TLC product in a reading process is different from that in a programming verification process. WLn+1 (i.e., the $(n+1)^{th}$ word line) is not programmed in the programming verification, while in most cases, the WLn+1 is programmed in the reading process.

However, in the NAND flash memory according to the related art, writing the WLn+1 would cause deviation of a threshold voltage of the memory cell on the WLn (i.e., the $n^{th}$ a word line), and thus causes an error in data reading.

SUMMARY

The present disclosure provides a method for reading a memory device, where the memory device includes a plurality of word lines and a plurality of multi-bit memory cells connected to the plurality of word lines, and each of the multi-bit memory cells is configured such that a stored value of the multi-bit memory cell is read through multi-level preset read voltages, and the method including: reading a multi-bit memory cell on an adjacent word line of a to-be-read multi-bit memory cell by using at least one sampling voltage, and determining at least one offset flag, each representing a size of a respective one of at least one read offset according to a sampling read value of each of the at least one sampling voltage; wherein the at least one sampling voltage is at least one of the multi-level preset read voltages; wherein the at least one sampling voltage comprises N sampling voltages, each of the multi-level preset read voltages corresponds to N+1 read offsets, and N is a positive integer greater than or equal to 2; and reading the to-be-read multi-bit memory cell, according to the multi-level preset read voltages and the at least one read offset of each of the multi-level preset read voltages, each corresponding to a respective one of the at least one offset flag.

In another aspect, the present disclosure further provides a memory device including a memory cell array and a peripheral circuit coupled to the memory cell array; where the memory cell array includes a plurality of word lines and a plurality of multi-bit memory cells connected to the plurality of word lines; the peripheral circuit is configured to read stored values of the multi-bit memory cells through multi-level preset read voltages, and the peripheral circuit is configured to read a multi-bit memory cell on an adjacent word line of a to-be-read multi-bit memory cell by using at least one sampling voltage, and determine at least one offset flag, each representing a size of a respective one of at least one read offset according to a sampling read value of each of the at least one sampling voltage; and read the to-be-read multi-bit memory cell, according to the multi-level preset read voltages and the at least one read offset of each of the multi-level preset read voltages, each corresponding to respective one of the at least one offset flag; the at least one sampling voltage is at least one of the multi-level preset read voltages; wherein the at least one sampling voltage comprises N sampling voltages, each of the multi-level preset read voltages corresponds to N+1 read offsets, and N is a positive integer greater than or equal to 2.

BRIEF DESCRIPTION OF THE DRAWINGS

In order to more clearly illustrate the technical solutions of the present disclosure, the accompanying drawings used in the description of the implementations according to the present disclosure are briefly described below. The accompanying drawings in the following description are merely some implementations of the present disclosure, and other figures may be obtained from the figures without creative effort by those skilled in the art.

DETAILED DESCRIPTION

The technical solutions in the implementations of the present disclosure is described below in conjunction with the accompanying drawings of the implementations of the present disclosure. The described implementations are only a part of the implementations of the present disclosure, rather than all of the implementations. Based on the implementations of the disclosure, all other implementations obtained by those skilled in the art without creative effort are within the scope of the disclosure.

The present disclosure is directed to a technical problem in the related art that when an adjacent word line of a to-be-read multi-bit memory cell of a memory device is being programmed, a shift in the threshold voltage of the to-be-read multi-bit memory cell is caused, and implementations according to the present disclosure are proposed to solve the problem.

Figure 1:
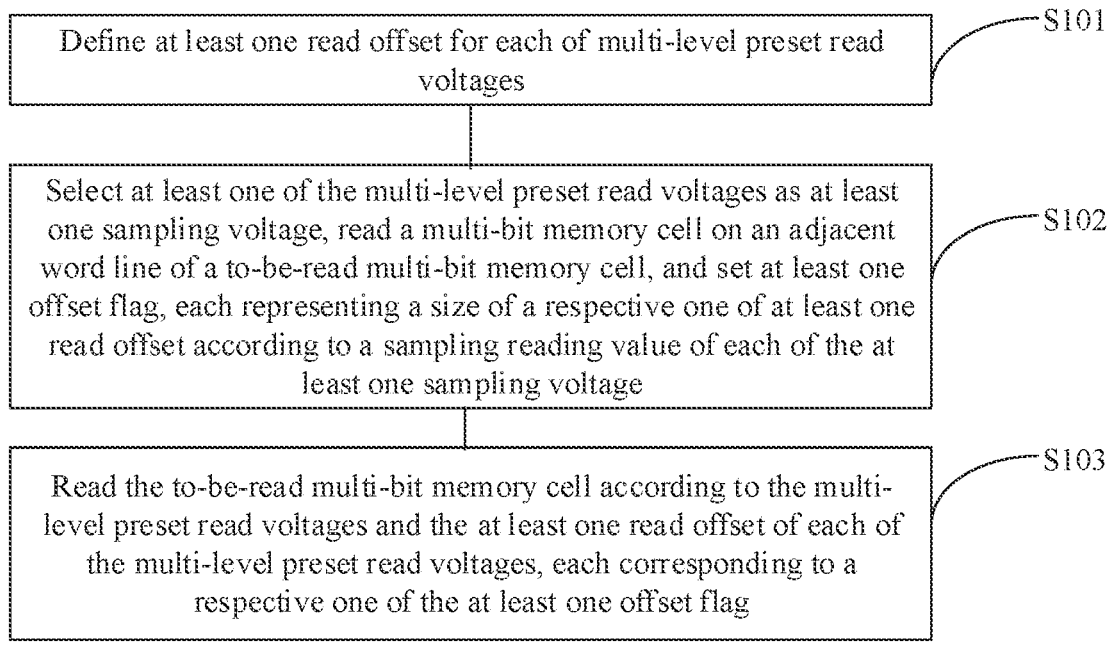
FIG. 1 is a flowchart of a method for reading a memory device according to an implementation of the present disclosure.

Referring to FIG. 1, which is a flowchart of a method for reading a memory device according to an implementation of the present disclosure. The memory device includes a plurality of word lines and a plurality of multi-bit memory cells connected to the plurality of word lines, and each of the multi-bit memory cells is configured such that a stored value of the multi-bit memory cell is read through multi-level preset read voltages. The method for reading the memory device includes the following steps.

In a defining step S101, at least one read offset is defined for each of the multi-level preset read voltages.

In an offset setting step S102, at least one of preset read voltages is selected as at least one sampling voltage from the multi-level preset read voltages, a multi-bit memory cell on an adjacent word line of a to-be-read multi-bit memory cell is read, and at least one offset flag, each representing a size of a respective one of the at least one read offset, is set according to a sampling reading value of a respective one of the at least one sampling voltage.

In a reading step S103, the to-be-read multi-bit memory cell is read according to the multi-level preset read voltages and the at least one read offset of each of the multi-level preset read voltages, each corresponding to a respective one of the at least one offset flag.

In some implementations, each of the multi-bit memory cells can store multi-bit data; the multi-bit memory cells may include but not limited to a multi-level cell (MLC), a trinary-level cell (TLC), a quad-level cell (QLC), and the like. In the implementations, the TLC is described. The TLC may be programmed in one of eight-level threshold voltages, and for each level threshold voltage of the eight-level threshold voltages, the TLC has a respective memory state, so that the trinary-level cell can store eight data. By applying a preset read voltage to the TLC, it can be determined which memory state the trinary-level cell is in, and then the stored value can be read out.

Each of the multi-bit memory cells has multi-level preset read voltages to read out the stored value of the multi-bit memory cell in different memory states. In the defining step S101, at least one read offset may be set for each of the multi-level preset read voltages, and at least one read offset may be set, so that the preset read voltage can be compensated when the multi-bit memory cell is subsequently read, thereby solving the problem of the shift of the threshold voltage of the multi-bit memory cell.

Figure 2:
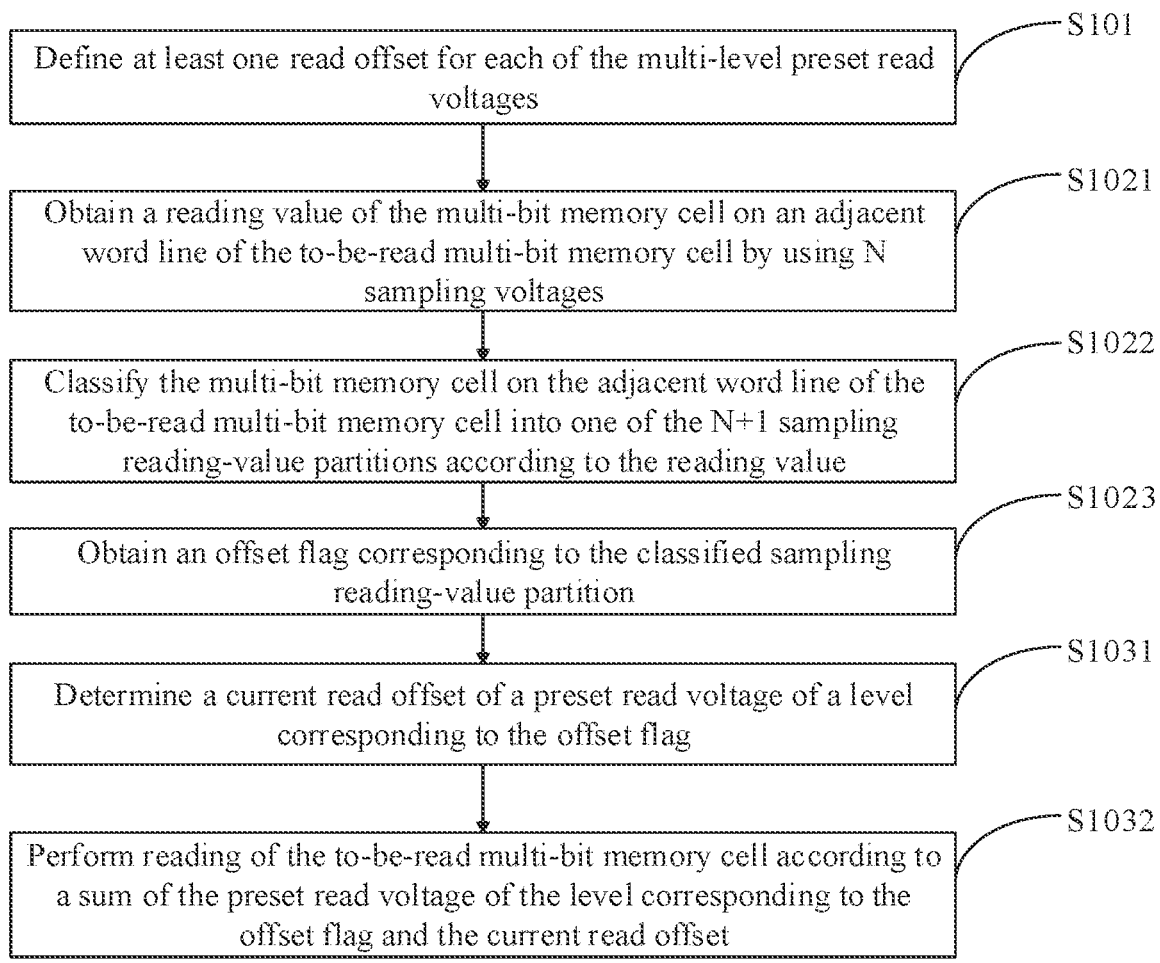
FIG. 2 is a further flowchart of a method for reading a memory device according to an implementation of the present disclosure.

Referring to FIG. 2, which is a further flowchart of a method for reading a memory device according to an implementation of the present disclosure. Each of the plurality of multi-bit memory cells may be configured to be programmed with one of multi-level threshold voltages. When the at least one sampling voltage includes N sampling voltages, the multi-bit memory cell may fall into one of N+1 sampling reading value partitions due to differences of the multi-level threshold voltages, and each of sampling reading value partitions corresponds to a respective offset flag. As shown in FIG. 2, the offset setting step S102 may further include the following steps.

In a sampling reading value obtaining step S1021, a reading value of the multi-bit memory cell on the adjacent word line of the to-be-read multi-bit memory cell is obtained by using the N sampling voltages.

In a sampling reading value partitioning step S1022, the multi-bit memory cell on the adjacent word line of the to-be-read multi-bit memory cell is classified into one of the N+1 sampling reading value partitions according to the reading value.

In an offset flag obtaining step S1023, an offset flag corresponding to the classified sampling reading value partition is obtained.

When the at least one sampling voltage includes one sampling voltage, there may be two sampling reading value partitions corresponding to the sampling voltage, and each of the sampling reading value partitions corresponds to a respective offset flag. Since the offset flag is represented by $\log_2 (N+1)$ bits, only one bit is required to represent the offset flag at this time, and the offset flag is stored in a program block latch of the memory device and has a value of 0 and a value of 1. When the at least one sampling voltage includes three sampling voltages, there may be four sampling reading value partitions corresponding to the sampling voltages, and two bits are required to represent the offset flag at this time, which has a value of 00, a value of 01, a value of 10, and a value of 11.

Taking one sampling voltage as an example, for example, if a sampling reading voltage R4 is taken, sampling reading values of memory cells whose threshold voltages are E, P1, P2, and P3 may be set to be 0, and sampling reading values of memory cells whose threshold voltages are P4, P5, P6, and P7 may be set to be 1. Taking three sampling voltages as an example, for example, if three sampling reading voltages R1, R4, and R7 are taken, sampling reading values of memory cells whose threshold voltages are E may be set to 00, sampling reading values of memory cells whose threshold voltages are P1, P2, and P3 may be set to be 01, sampling reading value of memory cells whose threshold value voltages are P4, P5, and P7 may be set to be 10, and sampling reading value of memory cells whose threshold value voltages are P7 may be set to be 10.

Continuing to refer to FIG. 2, the reading step S103 may include the following steps.

In determining step S1031, a current read offset of the preset read voltage of the level corresponding to the offset flag is determined.

In performing step S1032, reading of the to-be-read multi-bit memory cell is performed with a voltage that is a sum of the level preset read voltage and the current read offset.

When the at least one sampling voltage includes N sampling voltages, each of the multi-level preset read voltages has (N+1)-level read offsets, and a first-level read offset of the N+1 read offsets is 0. For example, when the at least one sampling voltage includes one sampling voltage, two-level read offsets may be set, and a first-level read offset of the two-level read offsets is 0. When the at least one sampling voltage includes three sampling voltages, fourth-level read offsets may be set, and a first-level read offset of the fourth-level read offsets is 0. For example, for the first-level preset read voltage, there may be three types of offsets: Offset1_R1, Offset2_R1, Offset3_R1; for the second-level preset read voltage, there may be three types of offsets: Offset1_R2, Offset2_R2, Offset3_R2, . . . , until for the seventh-level preset read voltage, there may be three types of offsets: Offset1_R7, Offset2_R7, Offset3_R7. Further, the read offsets include one of a voltage offset value and a voltage offset time.

In some implementations, the adjacent word line may be a word line immediately subsequent to a word line on which the to-be-read multi-bit memory cell is located. Further, according to the method for reading the memory device, the edge summation (ESUM) can be improved to 120 mV.

In an implementation, the multi-bit memory cells may be TLCs, and the fourth-level preset read voltage of the eight-level preset read voltages may be selected as the sampling voltage. In this case, there may be two sampling reading value partitions corresponding to the sampling voltage. That is, the zeroth-level to the third-level preset read voltages are in the first sampling reading value partition, the fourth-level to seventh-level preset read voltages are in the second sampling reading value partition, and each level of the preset read voltages may have two-level read offsets, where the first-level read offset may be 0. In the implementation, the adjacent word line is WLn+1, and the current word line is WLn. When WLn+1 is in the first sampling reading value partition, the read offset of WLn is 0; and when WLn+1 is in the second sampling reading value partition, the read offset of WLn is as the following.

| WLn level   | 1  | 2  | 3  | 4  | 5  | 6  | 7  |
|-------------|----|----|----|----|----|----|----|
| Read offset | 80 | 70 | 70 | 60 | 60 | 60 | 50 |

The present disclosure provides a method for reading a memory device. The memory device includes a plurality of word lines and a plurality of multi-bit memory cells connected to the plurality of word lines, and each of the multi-bit memory cells is configured such that a stored value of the multi-bit memory cell is read through multi-level preset read voltages. The method includes: defining at least one read offset for each of the multi-level preset read voltages respectively, selecting at least one of preset read voltage of the multi-level preset read voltage as the at least one sampling voltage, reading a multi-bit memory cell on an adjacent word line of a to-be-read multi-bit memory cell, and setting at least one offset flag, each representing a size of a respective one of the at least one read offset according to a sampling reading value of a respective one of the at least one sampling voltage; and then, the method further includes reading the to-be-read multi-bit memory cell according to the multi-level preset read voltages and the at least one read offset of each of the multi-level preset read voltages, each corresponding to a respective one of the at least one offset flag. Thus, the preset read voltages of the to-be-read multi-bit memory cell can be compensated, thereby effectively solving the problem of shift of threshold voltages of the to-be-read multi-bit memory cell that is caused when the adjacent word line of the to-be-read multi-bit memory cell of the memory device is being programmed.

Figure 3:
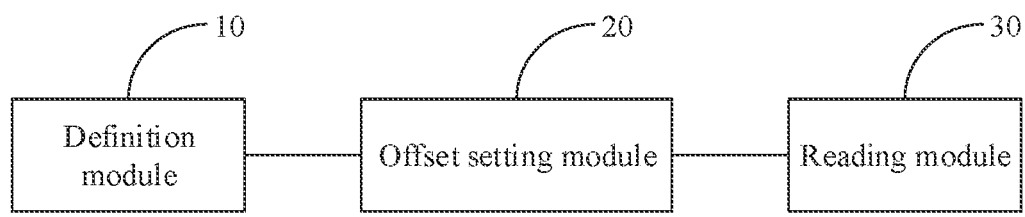
FIG. 3 is a schematic structural diagram of a voltage compensation device according to an implementation of the present disclosure.

Referring to FIG. 3, which is a schematic structural diagram of a voltage compensation device according to an implementation of the present disclosure. The voltage compensation device is applied to a memory device including a plurality of word lines and a plurality of multi-bit memory cells connected to the plurality of word lines, and each of the multi-bit memory cells is configured such that a stored value of the multi-bit memory cell is read through multi-level preset read voltages.

In some implementations, the memory device may include a memory cell array and a peripheral circuit. The memory cell array may include a plurality of memory blocks, each of the memory blocks includes a plurality of memory pages, and each of the memory pages includes a plurality of memory cells.

The peripheral circuit may include any suitable digital, analog, and/or mixed-signal circuit configured to facilitate various operations of the memory device such as reading operations, writing operations, erasing operations, and the like. For example, the peripheral circuit may include control logic (e.g., a control circuit or a controller), a data buffer, a decoder, a driver, a reading/writing circuit, and the like. When the control logic receives a reading/writing operation command and address data, the decoder may apply, based on a decoded address, a corresponding voltage from the driver to a corresponding bit line and word line under the control of the control logic, to implement data reading and writing and perform data exchange with external entities through the data buffer.

The voltage compensation device provided in the implementation may include a definition module 10, an offset setting module 20, and a reading module 30.

(1) Definition Module 10

The definition module 10 is configured to perform the definition step S101; that is, the definition module 10 is configured to define at least one read offset for each of the multi-level preset read voltages respectively.

(2) Offset Setting Module 20

The offset setting module 20 is configured to perform an offset setting step S102; that is, the offset setting module 20 is configured to select at least one of the multi-level preset read voltages as at least one sampling voltage, read a multi-bit memory cell on an adjacent word line of a to-be-read multi-bit memory cell, and set at least one offset flag, each representing a size of a respective one of the at least one read offset according to a sampling reading value of a respective one of the at least one sampling voltage.

In some implementations, each of the multi-bit memory cells can store multi-bit data; the multi-bit memory cells may include but are not limited to a multi-level cell (MLC), a trinary-level cell (TLC), a quad-level cell (QLC), and the like. In the implementations, the TLC is described. The TLC may be programmed in one of eight-level threshold voltages, and for each level threshold voltage of the eight-level threshold voltages, the TLC has a respective memory state, so that the trinary-level cell can store eight data. By applying a preset read voltage to the TLC, it can be determined which memory state the trinary-level cell is in, and then the stored value can be read out.

Each of the multi-bit memory cells has multi-level preset read voltages to read out the stored value of the multi-bit memory cell in different memory states. In the defining step S101, at least one read offset may be set for each of the multi-level preset read voltages, and at least one read offset may be set, so that the preset read voltage can be compensated when the multi-bit memory cell is subsequently read, thereby solving the problem of the shift of the threshold voltage of the multi-bit memory cell.

Figure 4:
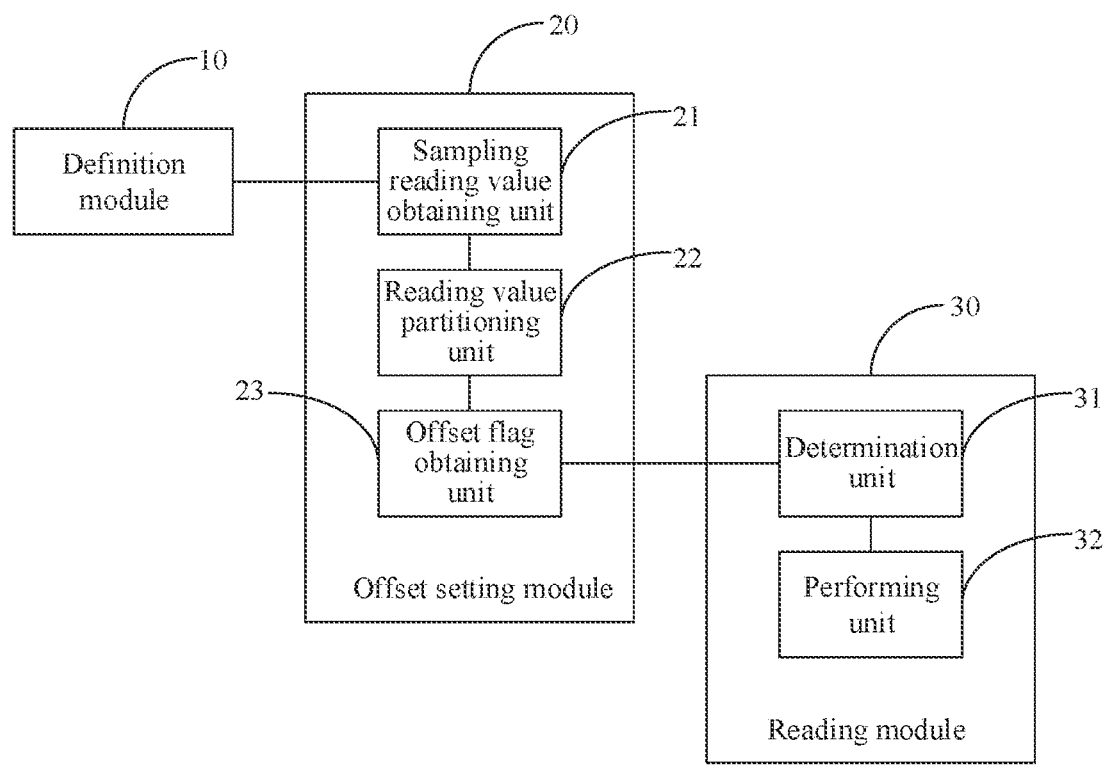
FIG. 4 is another schematic structural diagram of a voltage compensation device according to an implementation of the present disclosure.

Referring to FIG. 4, which is another schematic structural diagram of a voltage compensation device according to an implementation of the present disclosure. Each of the plurality of multi-bit memory cells may be configured to be programmed in one of multi-level threshold voltages. When the at least one sampling voltage includes N sampling voltages, the multi-bit memory cell may fall into one of N+1 sampling reading value partitions due to differences of the multi-level threshold voltages, and each of sampling reading value partitions may correspond to a respective one of the offset flags. The offset setting module 20 may further include a sampling reading value obtaining unit 21, a reading value partitioning unit 22, and an offset flag obtaining unit 23.

The sampling reading value obtaining unit 21 may be configured to obtain, by using the N sampling voltages, a reading value of the multi-bit memory cell on the adjacent word line of the to-be-read multi-bit memory cell.

The reading value partitioning unit 22 may be configured to classify the multi-bit memory cell on the adjacent word line of the to-be-read multi-bit memory cell into one of the N+1 sampling reading value partitions according to the reading value;

The offset flag obtaining unit 23 may be configured to obtain an offset flag corresponding to the classified sampling reading value partition.

When the at least one sampling voltage includes one sampling voltage, there may be two sampling reading value partitions corresponding to the sampling voltage, and each of the sampling reading value partitions corresponds to a respective offset flag. Since the offset flag is represented by $\log_2 (N+1)$ bits, only one bit is required to represent the offset flag at this time, and the offset flag is stored in a program block latch of the memory device and has a value of 0 and a value of 1. When the at least one sampling voltage includes three sampling voltages, there may be four sampling reading value partitions corresponding to the sampling voltages, and two bits are required to represent the offset flag at this time, which has a value of 00, a value of 01, a value of 10, and a value of 11.

(3) Reading Module 30

The reading module 30 is configured to read the to-be-read multi-bit memory cell in the reading step S103; that is, the reading module 30 is configured to read the to-be-read multi-bit memory cell according to the multi-level preset read voltages and the at least one read offset of each of the multi-level preset read voltages, each corresponding to a respective one of the at least one offset flag.

Referring to FIG. 4, the reading module 30 may include a determination unit 31 and a performing unit 32.

The determination unit 31 may be configured to determine a current read offset of a preset read voltage of a level corresponding to the offset flag.

The performing unit 32 may be configured to perform a reading of the to-be-read multi-bit memory cell with a voltage that is a sum of the preset read voltage of the level corresponding to the offset flag and the current read offset.

When the at least one sampling voltage includes N sampling voltages, each of the multi-level preset read voltages has (N+1)-level read offsets, and a first-level read offset of the N+1 read offsets is 0. For example, when the at least one sampling voltage includes one sampling voltage, two-level read offsets may be set, and a first-level read offset of the two-level read offsets is 0. When the at least one sampling voltage includes three sampling voltages, fourth-level read offsets may be set, and a first-level read offset of the fourth-level read offsets is 0. Further, the read offsets include one of a voltage offset value and a voltage offset time.

In some implementations, the offset flag may be stored in a program block latch of the memory device; further, when the sample voltages include N sampling voltages, the program block latch may have $\log_2 (N+1)$ data bits for storing the offset flag.

In some implementations, the voltage compensation device may be applicable to an operation of reading a low page(s) of the memory device, an operation of reading an intermediate page(s) of the memory device, and an operation of reading a high page(s) of the memory device.

In some implementations, according to the voltage compensation device, ESUM can be improved to 120 mV.

In contrast to the related art, the present disclosure provides a voltage compensation device applied to a memory device. The memory device includes a plurality of word lines and a plurality of multi-bit memory cells connected to the plurality of word lines, and the multi-bit memory cells are configured such that stored values of the multi-bit memory cells are read through multi-level preset read voltages. The voltage compensation device includes a definition module 10, an offset setting module 20, and a reading module 30. The definition module 10 is configured to define at least one read offset for each of the multi-level preset read voltages respectively; the offset setting module 20 is configured to select at least one of the multi-level preset read voltages as the at least one sampling voltage, read a multi-bit memory cell on an adjacent word line of a to-be-read multi-bit memory cell, and set at least one offset flag, each representing a size of a respective one of the at least one read offset according to a sampling reading value of the a respective one of the at least one sampling voltage; and the reading module 30 is configured to read the to-be-read multi-bit memory cell according to the multi-level preset read voltages and the at least one read offset of each of the multi-level preset read voltages, each corresponding to a respective one of the at least one offset flag, Thus, the preset read voltages of the to-be-read multi-bit memory cell can be compensated, thereby effectively solving the problem of shift of threshold voltages of the to-be-read multi-bit memory cell that is caused when the adjacent word line of the to-be-read multi-bit memory cell of the memory device is being programmed.

In addition to the aforementioned implementations, there may be other implementations of the present disclosure. All technical solutions formed by equivalent replacements or equivalent substitutions fall within the scope of the present disclosure.

In summary, although the implementations of the present disclosure have been disclosed above, the aforementioned implementations are not intended to limit the present disclosure, and a person of ordinary skill in the art may make various changes and modifications without departing from the spirit and scope of the present disclosure. Therefore, the protection scope of the present disclosure is subject to the scope defined by the claims.

The invention claimed is:

1. A method for reading a memory device, wherein the memory device comprises a plurality of word lines and a plurality of multi-bit memory cells connected to the plurality of word lines, each of the multi-bit memory cells being configured such that a stored value of the multi-bit memory cell is read through multi-level preset read voltages, the method comprising:
    reading a multi-bit memory cell on an adjacent word line of a to-be-read multi-bit memory cell by using at least one sampling voltage;
    determining at least one offset flag, each representing a size of a respective one of at least one read offset according to a sampling read value of each of the at least one sampling voltage, wherein the at least one sampling voltage is at least one of the multi-level preset read voltages, the at least one sampling voltage comprises N sampling voltages, each of the multi-level preset read voltages corresponds to N+1 read offsets, and N is a positive integer greater than or equal to 2; and
    reading the to-be-read multi-bit memory cell, according to the multi-level preset read voltages and the at least one read offset of each of the multi-level preset read voltages, each corresponding to a respective one of the at least one offset flag.

2. The method of claim 1, wherein each of the plurality of multi-bit memory cells is configured to be programmed in one of multi-level threshold voltages, the multi-bit memory cell falls into one of N+1 sampling reading value partitions due to differences of the multi-level threshold voltages, and each of sampling reading value partitions corresponds to a respective one of the at least one offset flag.

3. The method of claim 2, wherein determining the at least one offset flag comprises:
    obtaining, by using the N sampling voltages, a reading value of the multi-bit memory cell on the adjacent word line of the to-be-read multi-bit memory cell;
    classifying, according to the reading value, the multi-bit memory cell on the adjacent word line of the to-be-read multi-bit memory cell into one of the N+1 sampling reading value partitions; and determining an offset flag corresponding to the classified sampling reading value partition.

4. The method of claim 3, wherein reading the to-be-read multi-bit memory cell comprises:
   determining a current read offset of a preset read voltage of a level corresponding to the offset flag; and
   performing reading of the to-be-read multi-bit memory cell according to a sum of the preset read voltage of the level corresponding to the offset flag and the current read offset.

5. The method of claim 1, further comprising:
   defining N+1 read offsets corresponding to each of the multi-level preset read voltages.

6. The method of claim 1, wherein the offset flag is represented by $\log_2(N+1)$ bits.

7. The method of claim 1, wherein the read offset comprises one of a voltage offset value or a voltage offset time.

8. The method of claim 1, wherein the adjacent word line is a word line immediately subsequent to a word line on which the to-be-read multi-bit memory cell is located.

9. The method of claim 1, wherein the multi-bit memory cell comprises a three-bit memory cell, and the memory device comprises a low page, an intermediate page, and a high page; and
   the method is applicable to an operation of reading the low page, an operation of reading the intermediate page, and an operation of reading the high page.

10. A memory device, comprising:
    a memory cell array and a peripheral circuit coupled to the memory cell array, wherein
    the memory cell array comprises a plurality of word lines and a plurality of multi-bit memory cells connected to the plurality of word lines; and
    the peripheral circuit is configured to:
       read a stored value of each of the multi-bit memory cells through multi-level preset read voltages;
       read a multi-bit memory cell on an adjacent word line of a to-be-read multi-bit memory cell by using at least one sampling voltage;
       determine at least one offset flag, each representing a size of a respective one of at least one read offset according to a sampling read value of each of the at least one sampling voltage; and
       read the to-be-read multi-bit memory cell, according to the multi-level preset read voltages and the at least one read offset of each of the multi-level preset read voltages, each corresponding to a respective one of the at least one offset flag,
    wherein the at least one sampling voltage is at least one of the multi-level preset read voltages, the at least one sampling voltage comprises N sampling voltages, each of the multi-level preset read voltages corresponds to N+1 read offsets, and N is a positive integer greater than or equal to 2.

11. The memory device of claim 10, wherein each of the plurality of multi-bit memory cells is configured to be programmed in one of multi-level threshold voltages, the multi-bit memory cell falls into one of N+1 sampling reading value partitions due to differences of the multi-level threshold voltages, and each of sampling reading value partitions corresponds to a respective one of the at least one offset flag.

12. The memory device of claim 11, wherein the peripheral circuit comprises:
    a sampling reading value obtaining unit, configured to:
       obtain, by using the N sampling voltages, a reading value of the multi-bit memory cell on the adjacent word line of the to-be-read multi-bit memory cell;
       classify, according to the reading value, the multi-bit memory cell on the adjacent word line of the to-be-read multi-bit memory cell into one of the N+1 sampling reading value partitions; and
       determine an offset flag corresponding to the classified sampling reading value partition.

13. The memory device of claim 12, wherein the peripheral circuit is configured to:
    determine a current read offset of a preset read voltage of a level corresponding to the offset flag; and
    perform reading of the to-be-read multi-bit memory cell according to a sum of the preset read voltage of the level corresponding to the offset flag and the current read offset.

14. The memory device of claim 10, wherein the offset flag is stored in a program block latch of the memory device.

15. The memory device of claim 14, wherein the program block latch has $\log_2(N+1)$ data bits for storing the offset flag.

* * * * *